(12) United States Patent
Pennypacker et al.

(10) Patent No.: US 7,448,877 B1
(45) Date of Patent: Nov. 11, 2008

(54) HIGH DENSITY FLEXIBLE SOCKET INTERCONNECT SYSTEM

(75) Inventors: Jeffrey George Pennypacker, Harrisburg, NY (US); Jason M'Cheyne Reisinger, Carlisle, PA (US); Jeffrey Byron McClinton, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/858,414

(22) Filed: Sep. 20, 2007

(51) Int. Cl.
*H01R 12/00* (2006.01)
(52) U.S. Cl. ...................................... 439/66
(58) Field of Classification Search ............... 439/66, 439/65, 75
See application file for complete search history.

(56) References Cited

U.S. PATENT DOCUMENTS

| | | | |
|---|---|---|---|
| 4,548,451 A | 10/1985 | Benarr et al. | |
| 6,358,064 B2 | 3/2002 | Szalay et al. | |
| 6,830,460 B1 | 12/2004 | Rathburn | |
| 6,939,143 B2 | 9/2005 | Rathburn | |
| 6,957,963 B2 | 10/2005 | Rathburn | |
| 7,070,420 B1 | 7/2006 | Wakefield et al. | |
| 7,121,839 B2 | 10/2006 | Rathburn | |
| 7,220,135 B1 * | 5/2007 | Brekosky et al. | 439/75 |

* cited by examiner

*Primary Examiner*—Khiem Nguyen

(57) ABSTRACT

An interconnect member for socket connector includes a carrier having opposite first and second sides. A plurality of polymer columns are held in the carrier. Each polymer column includes a first end extending from the first side of the carrier and a second end extending from the second side of the carrier. A contact array includes a plurality of electrical contacts held in the carrier. Each of the plurality of contacts includes a body that extends through the carrier and opposite end portions positioned to engage respective first and second ends of the polymer columns. Each end portion includes a contact tip configured to electrically engage a contact pad on one of a circuit board and an electronic package. The polymer columns simultaneously provide a predetermined normal force to establish reliable electrical connectivity between the circuit board and the electronic package and a predetermined working range for the interconnect member.

20 Claims, 11 Drawing Sheets

HIGH DENSITY FLEXIBLE SOCKET INTERCONNECT SYSTEM

BACKGROUND OF THE INVENTION

The invention relates generally to surface mounted connectors on printed circuit boards, and more specifically, to a high density flexible contact system for use in socket connectors.

The trend toward smaller, lighter, and higher performance electrical components and higher density electrical circuits led to the development of surface mount technology in the design of printed circuit boards. As is well understood in the art, surface mountable packaging allows for the connection of an electronic package to pads on the surface of the circuit board rather than by contacts or pins soldered in plated holes going through the circuit board. Surface mount technology allows for an increased component density on a circuit board, thereby saving space on the circuit board.

The land grid array (LGA) is one type of surface mount electronic package that has developed in response to the demand created by higher density electrical circuits for increased density of electrical connections on the circuit board. The land grid array includes an array of connections on the bottom side of the package. In the traditional land grid array connector, stamped and formed contacts having flexible contact beams are soldered to the circuit board using solder balls placed at contact locations on the circuit board. The contact beams must be compressed or deflected sufficiently to generate a required normal force on the package to reliably mate the package to the contacts. As a result, the stamped and formed contacts must have sufficient length and working range to generate the required normal force. In some socket connectors, stamped and formed contacts are replaced with compressible conductive polymer columns. However, as contact size decreases and as contact density increases, such devices may encounter problems associated with creep of the polymer material with time and at elevated temperatures. Next generation devices such as mobile and desktop devices may be expected to require even more reduction in contact pitch in interconnect devices, due to size and space limitations while providing improved electrical performance.

Thus, a need exists for a compressible contact system that can be economically produced at a reduced contact pitch to meet the demands for improved electrical performance at higher contact densities.

BRIEF DESCRIPTION OF THE INVENTION

In one embodiment, an interconnect member for a socket connector is provided. The interconnect member includes a carrier having opposite first and second sides. A plurality of polymer columns are held in the carrier. Each polymer column includes a first end extending from the first side of the carrier and a second end extending from the second side of the carrier. A contact array includes a plurality of electrical contacts held in the carrier. Each of the plurality of contacts includes a body that extends through the carrier and opposite end portions positioned to engage respective first and second ends of the polymer columns. Each end portion includes a contact tip configured to electrically engage a contact pad on one of a circuit board and an electronic package. The polymer columns simultaneously provide a predetermined normal force to establish reliable electrical connectivity between the circuit board and the electronic package and a predetermined working range for the interconnect member.

Optionally, the carrier is fabricated from a non-conductive material or from an insulated metal. A portion of the body may be coated with an insulative material. The polymer columns comprise a pure polymer. A plurality of insulative retaining members are held in the carrier, each of the insulative retaining members holding one of the plurality of contacts. In one embodiment, the body of each contact has a transverse width and the end portion of the contact includes an intermediate section, and wherein the contact tips extend from the intermediate section in a direction parallel to a direction of the transverse width to position the contact tips along a row of polymer columns to engage a polymer column in the row. The contact tip may include an upturned contact end. Alternatively, the contact tip may include an outer perimeter that defines an interior volume that is at least partially enclosed by the outer perimeter, and wherein a portion of the outer perimeter is configured to engage a contact pad on one of the circuit board and the electronic package.

In another embodiment, a socket connector for connecting an electronic package to a circuit board is provided. The connector includes a dielectric housing configured to be mounted on the circuit board; and an interconnect member held in the housing. The interconnect member includes a carrier having opposite first and second sides. A plurality of polymer columns are held by the carrier. Each polymer column includes a first end extending from the first side of the carrier and a second end extending from the second side of the carrier. A contact array includes a plurality of electrical contacts held in the carrier. Each of the plurality of contacts includes a body that extends through the carrier and opposite end portions positioned to engage respective first and second ends of the polymer columns. Each end portion includes a contact tip configured to electrically engage a contact pad on one of a circuit board and an electronic package. The polymer columns simultaneously provide a predetermined normal force to establish reliable electrical connectivity between the circuit board and the electronic package and a predetermined working range for the interconnect member.

DETAILED DESCRIPTION OF THE INVENTION

Figure 1:
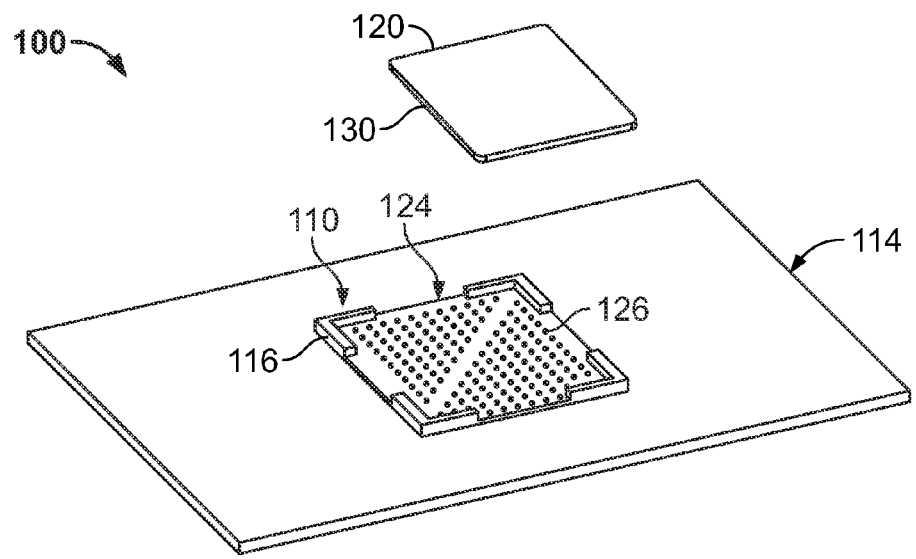
FIG. 1 is an exploded view of an electronic assembly including a socket connector having an interconnect member formed in accordance with an exemplary embodiment of the present invention.

FIG. 1 illustrates an electronic assembly 100 including a socket connector 110 that is mounted on a circuit board 114. An electronic package 120 is loaded onto the socket connector 110. When loaded onto the socket connector 110, the electronic package 120 is electrically connected to the circuit board 114. The electronic package 120 may be a chip or module such as, but not limited to, a central processing unit (CPU), microprocessor, or an application specific integrated circuit (ASIC), or the like.

The socket connector 110 includes a dielectric housing 116 that is configured to be mounted on the circuit board 114. The housing 116 holds an interconnect member 124 formed in accordance with an exemplary embodiment of the present invention. The interconnect member 124 includes a plurality of electrical contact assemblies 126. The electronic package 120 has a mating surface 130 that engages the interconnect member 124. The interconnect member 124 is interposed between contact pads (not shown) on the mating surface 130 of the electronic package 120 and corresponding contact pads (not shown) on the circuit board 114 to provide electrical paths to electrically connect the electronic package 120 to the circuit board 114 as will be described. It is to be understood, however, that such description is for illustrative purposes only and that no limitation is intended thereby. That is, the interconnect member 124, in other embodiments, may be used to interconnect two circuit boards or two electronic packages. Further, although the interconnect member 124 is described with reference to a purely compressive interconnect member, it is to be understood that the interconnect member 124 may also be used in applications where other connection methods, such as solder connections on one or both sides of the interconnect member 124, are employed.

Figure 2:
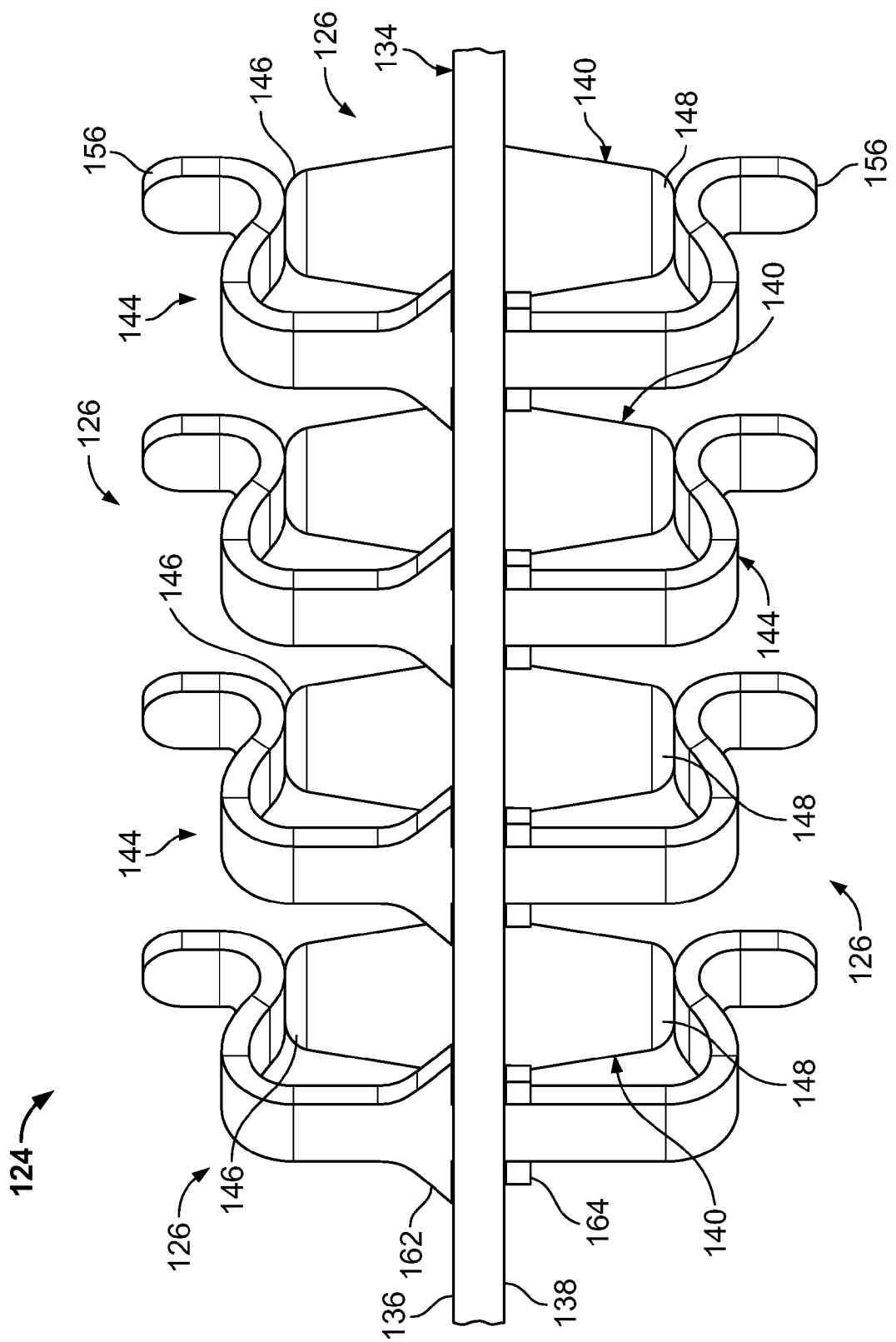
FIG. 2 is an enlarged front elevational view of a portion of the interconnect member shown in FIG. 1.

FIG. 2 illustrates an enlarged front elevational view of a portion of the interconnect member 124. The interconnect member 124 includes a carrier 134 on which the contact assemblies 126 are arranged. The carrier 134 has a first side 136 and an opposite second side 138. Each contact assembly 126 includes a polymer column 140 and a contact 144, both of which are held in the carrier 134. Each polymer column 140 includes a first end 146 extending from the first side 136 of the carrier 134 and a second end 148 extending from the second side 138 of the carrier 134.

Figure 3:
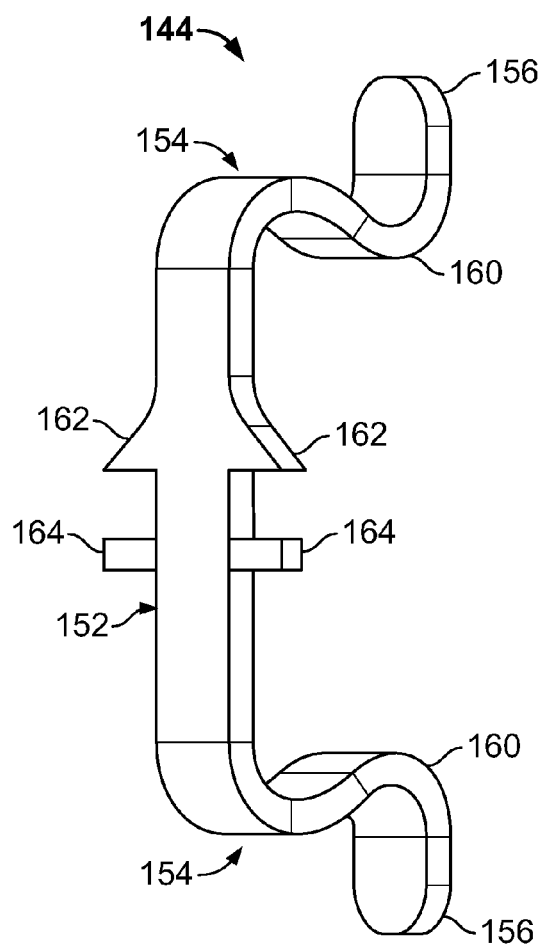
FIG. 3 is a perspective view of a contact shown in FIG. 2.

With continued reference to FIG. 2, FIG. 3 illustrates a contact 144. Each contact 144 includes an elongated body 152 that extends through the carrier 134 and opposite end portions 154 that are positioned to engage respective first and second ends 146, 148 of the polymer columns 140. Each end portion 154 includes a contact tip 156 that is configured to electrically engage a contact pad (not shown) of the circuit board 114 (FIG. 1) or the electronic package 120 (FIG. 1). As illustrated in FIGS. 2 and 3, the end portion 154 includes an arcuate bend 160 that orients the contact tips 156 sufficiently beyond the ends 146 and 148 of the polymer columns 140 such that no other portion of the contact 144 comes into contact with the flat surfaces of the circuit board 114 or the mating surface 130 of the electronic package 120 and further to facilitate accurate registration of the contact tips 156 with the contact pads on the circuit board 114 and the mating surface 130 of the electronic package 120. It is to be understood that, while the contact tip 156 is shown as an upturned end, other contact tip geometries may be provided that also achieve the aforementioned condition. The contact body 152 includes shoulders 162 and locking tabs 164. When installed in the carrier 134, the shoulders 162 engage one surface 136, 138 of the carrier 134 and the locking tabs 164 are bent and engage the opposite surface 136, 138 of the carrier 134 to retain the contact 144 in the carrier 134.

In an exemplary embodiment, the polymer columns 140 are formed from a pure polymer. The polymer columns 140 are sized and selected from a polymer material having a durometer such that when the electronic package 120 is loaded into the socket connector 110 the polymer columns 140 simultaneously provide a predetermined normal force between the contact tips 156 and the contact pads (not shown) on the circuit board 114 (FIG. 1) and the electronic package 120 (FIG. 1) to establish reliable electrical connectivity between respective contact pads (not shown) on the circuit board 114 and the electronic package 120 and establish a predetermined working range for the interconnect member 124. Separating the mechanical properties, i.e. the normal force and working range, in the polymer columns 140 and the electrical properties in the contacts 144, facilitates forming the interconnect member 124 at higher contact densities or reduced contact pitch.

Figure 4:
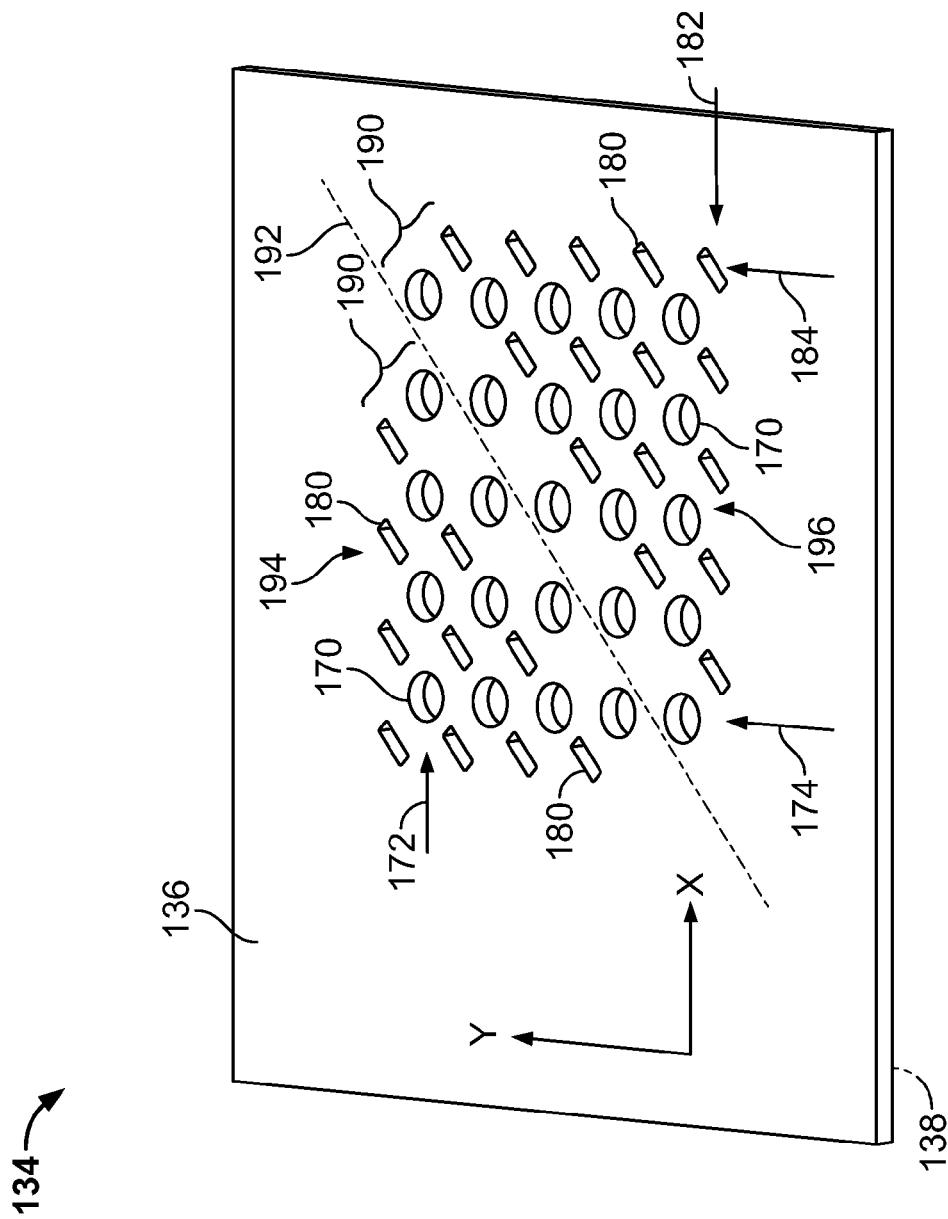
FIG. 4 is a perspective view of the carrier shown in FIG. 2.

FIG. 4 illustrates a perspective view of the carrier 134. The carrier 134 includes a plurality of apertures 170 arranged in an array including rows 172 parallel to the axis arrow X and columns 174 parallel to the axis arrow Y. In one embodiment, the polymer columns 140 are over-molded onto the carrier 134 and held in the apertures 170. Alternatively, the polymer columns 140 may be separately molded and inserted into the apertures 170. The rows 172 and columns 174 may or may not be perpendicular to one another depending on requirements for a particular application. A plurality of slits 180 are formed in the carrier 134 for holding the contacts 144. The slits 180 are also arranged in rows 182 parallel to the rows 172 of polymer columns 140 and in columns 184 parallel to the columns 174 of polymer columns 140. The slits 180 are sized to receive the end portions 154 of the contacts 144. In an exemplary embodiment, the apertures 170 and slits 180 may be formed by etching the carrier 134 which facilitates accurate positioning of the apertures 170 and slits 180. Alternatively however, the apertures 170 and slits 180 may be molded or stamped into the carrier 134.

The apertures 170 and slits 180 define locations 190 of the contact assemblies 126. The apertures 170 and slits 180 are arranged on opposite sides of a diagonal 192 that divides the contact locations 190 into two contact groups 194 and 196. The contact assemblies 126 on opposite sides of the diagonal 192 face each other to neutralize frictional forces on the electronic package 120 (FIG. 1) that result from the compression of the contact assemblies 126 that would otherwise tend to push the electronic package 120 toward one corner of the socket connector 110 (FIG. 1).

In some embodiments, the carrier 134 may be formed from an insulative material such as FR4, which is commonly used for circuit boards, or a polyimide material. Alternatively, the carrier 134 may be formed from an insulated metal such insulated stainless steel. In yet another alternative, a portion of the contact body 152 may be insulated and the contact 144 used in combination with a metallic carrier 134.

Figure 5:
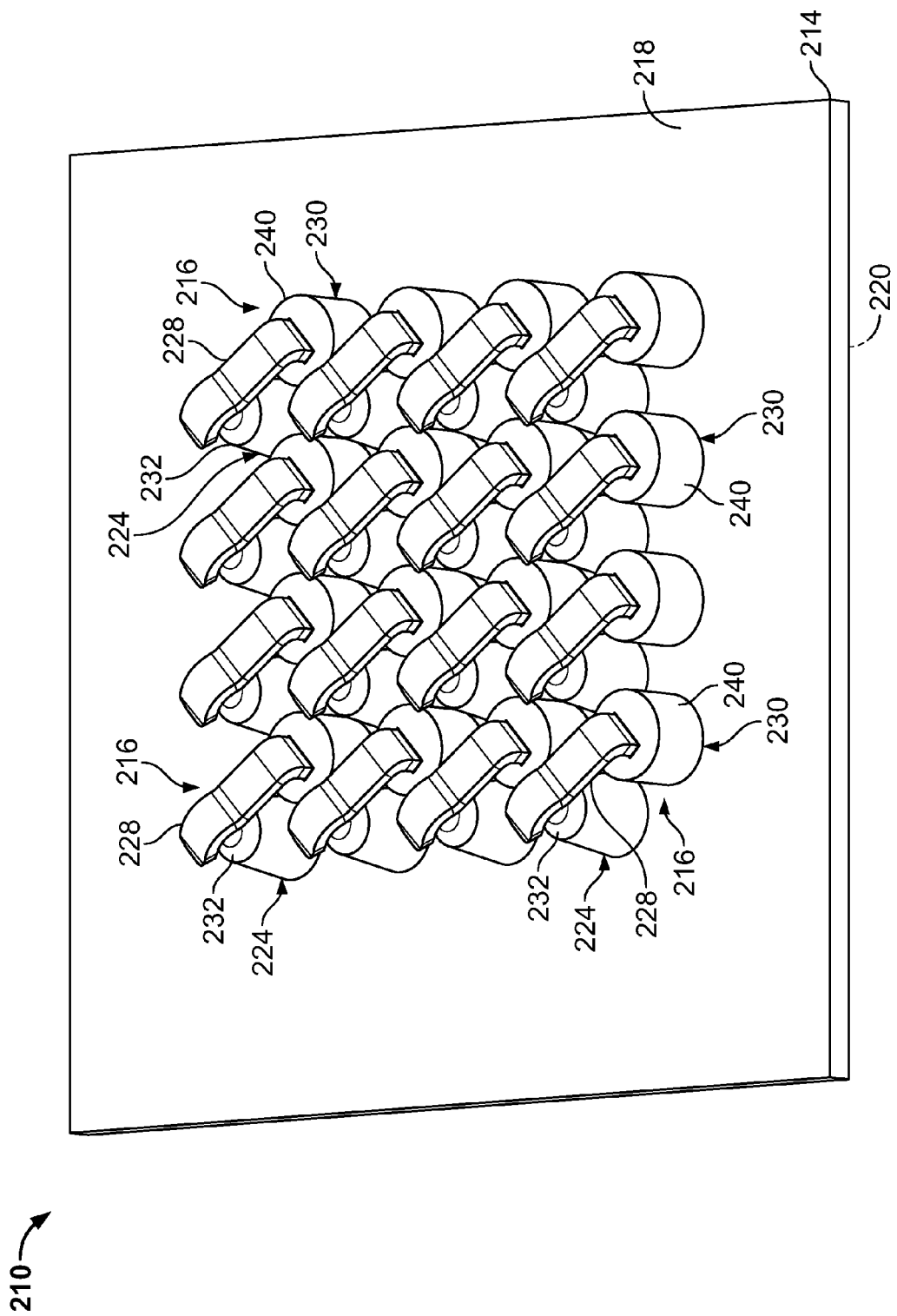
FIG. 5 is a top perspective view of an interconnect member formed in accordance with an alternative embodiment of the present invention.
Figure 6:
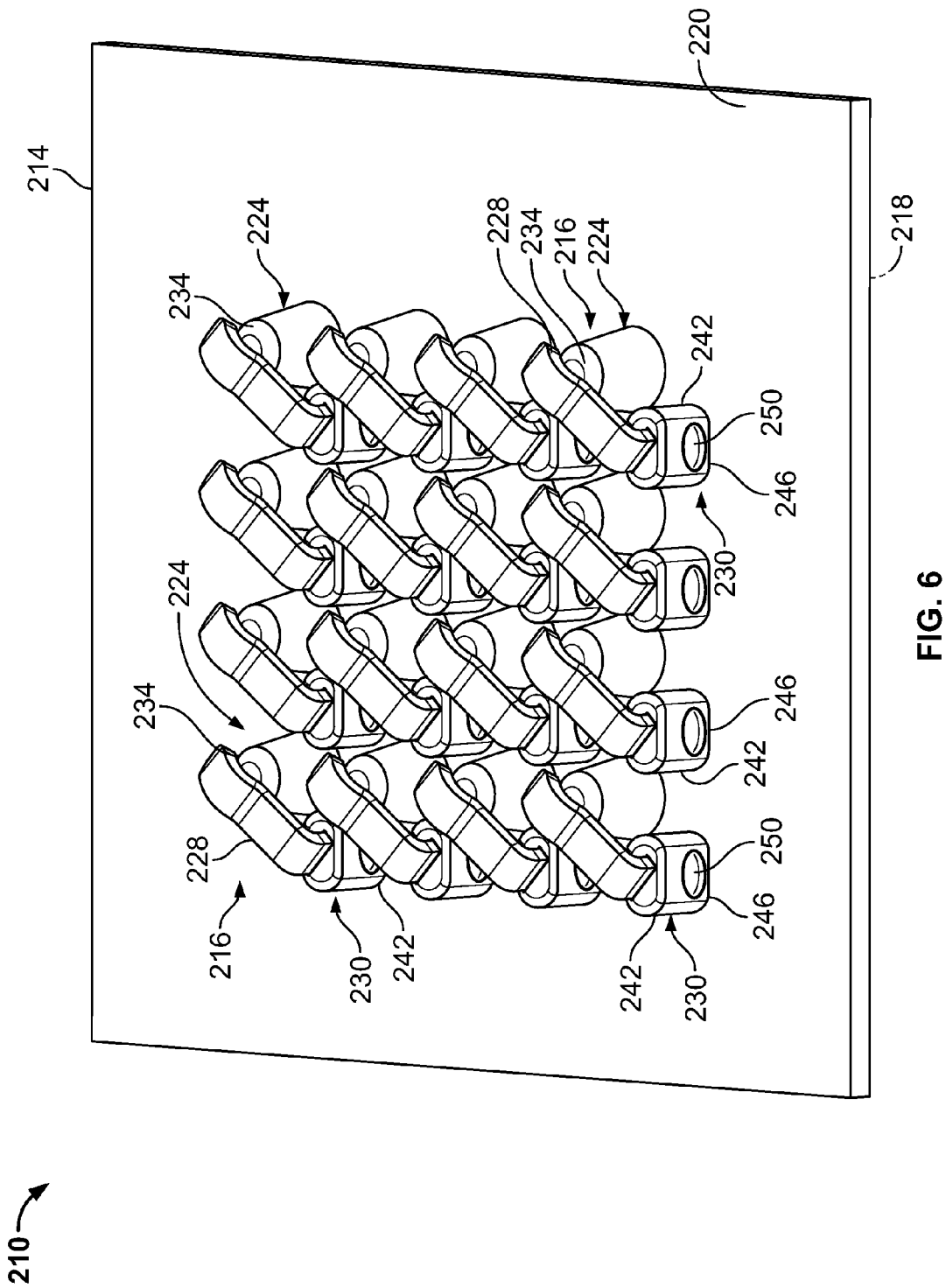
FIG. 6 is a bottom perspective view of the interconnect member shown in FIG. 5.

FIG. 5 illustrates a top perspective view of an interconnect member 210 formed in accordance with an alternative embodiment of the present invention FIG. 6 illustrates a bottom perspective view of the interconnect member 210. The interconnect member 210 includes a carrier 214 that holds a plurality of contact assemblies 216 arranged in an array. The carrier 214 has a first side 218 and an opposite second side 220. Each contact assembly 216 includes a polymer column 224, an electrical contact 228, and an insulative retaining member 230 holding the contact 228. The polymer columns 224 are substantially identical to the polymer columns 140 previously described, having a first end 232 extending from the first side 218 of the carrier 214 and an opposite second end 234 that extends from the second side 220 of the carrier 214. The polymer columns 224 are designed to provide the desired mechanical properties of the contact assemblies 216.

Each retaining member 230 includes an upper end 240 that abuts and extends from the first side 218 of the carrier 214. A lower end 242 extends through an aperture 246 in the carrier 214 that is sized to receive and hold the retaining member 230. The lower end 242 includes a retaining element 250 that locks the retaining member 230 in the carrier 214 after insertion into the carrier 214. In one embodiment, the retaining element 250 is a bump or protrusion formed on the lower end 242. The retaining members 230 are formed from a rigid insulative material and are over-molded on the contacts 228. The retaining members 230 with the contacts 228 are loaded into the carrier 214 from the first side 218. The retaining members 230 isolate the contacts 228 from the carrier 214.

Figure 7:
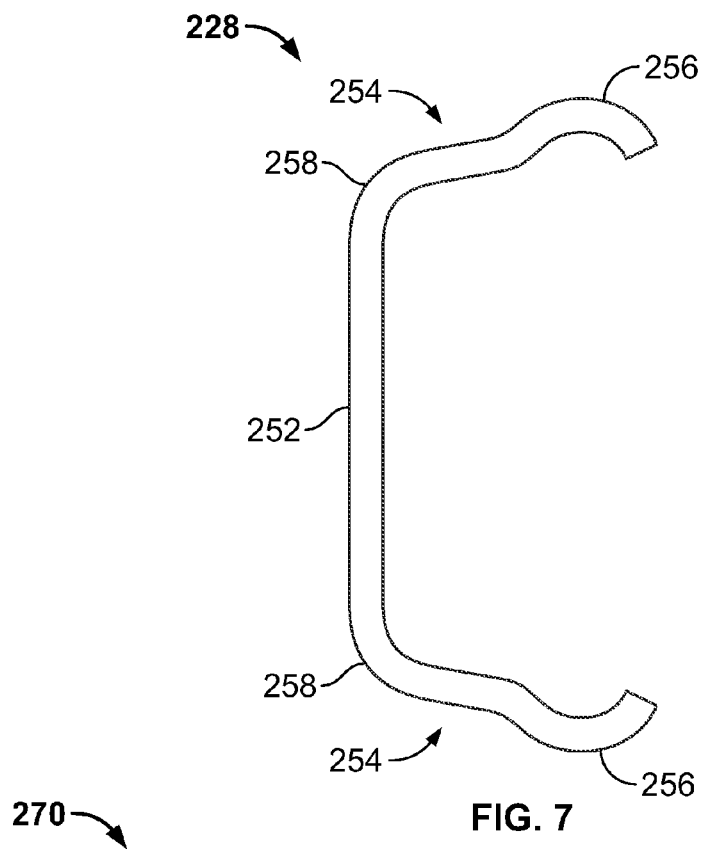
FIG. 7 illustrates a perspective view of the contact shown in FIG. 5.

With continued reference to FIGS. 5 and 6, FIG. 7 illustrates a perspective view of the contact 228. Each contact 228 includes an elongated body 252 upon which the retaining member 230 is over-molded. Opposite end portions 254 include contact tips 256 that are configured to engage contact pads (not shown) on the circuit board 114 and the electronic package 120 (FIG. 1). Arcuate bends 258 join the end portions 254 to the body 252 and position the contact tips 256 over the first and second ends 232 and 234 respectively of the polymer columns 224. The contact tips 256 are formed with an arched shape that covers the first and second ends 232 and 234 of the polymer columns 224 and positions the contact tips 256 in closest proximity to the circuit board 114 and the electronic package 120 relative to other portions of the contact 228.

Figure 8:
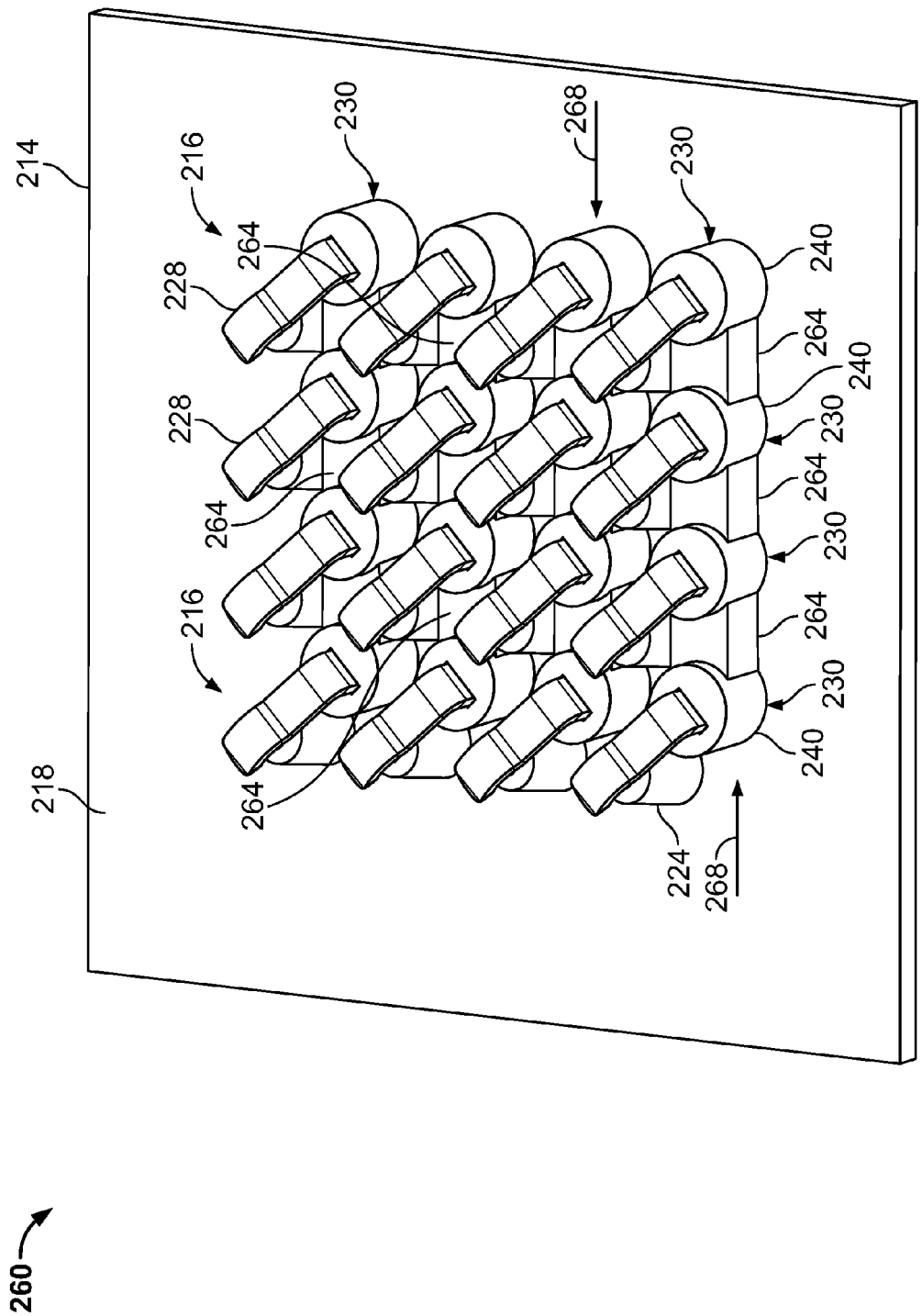
FIG. 8 is a perspective view of another alternative embodiment of an interconnect member formed in accordance with the present invention.

FIG. 8 illustrates a top perspective view of another alternative interconnect member 260. The interconnect member 260 is similar to the interconnect member 210 previously described with the exception that the interconnect member 260 incorporates a plurality of the bars 264 that interconnect or link the retaining members 230 in contact rows 268. The tie bars 264 interconnect upper ends 240 of the retaining members 230 in the contact rows 268 on the first side 218 of the carrier 214. When the retaining members 230 are linked together, the retaining members 230 and contacts 228 are loaded into the carrier 214 simultaneously in rows 268 as opposed to individually.

Figure 9:
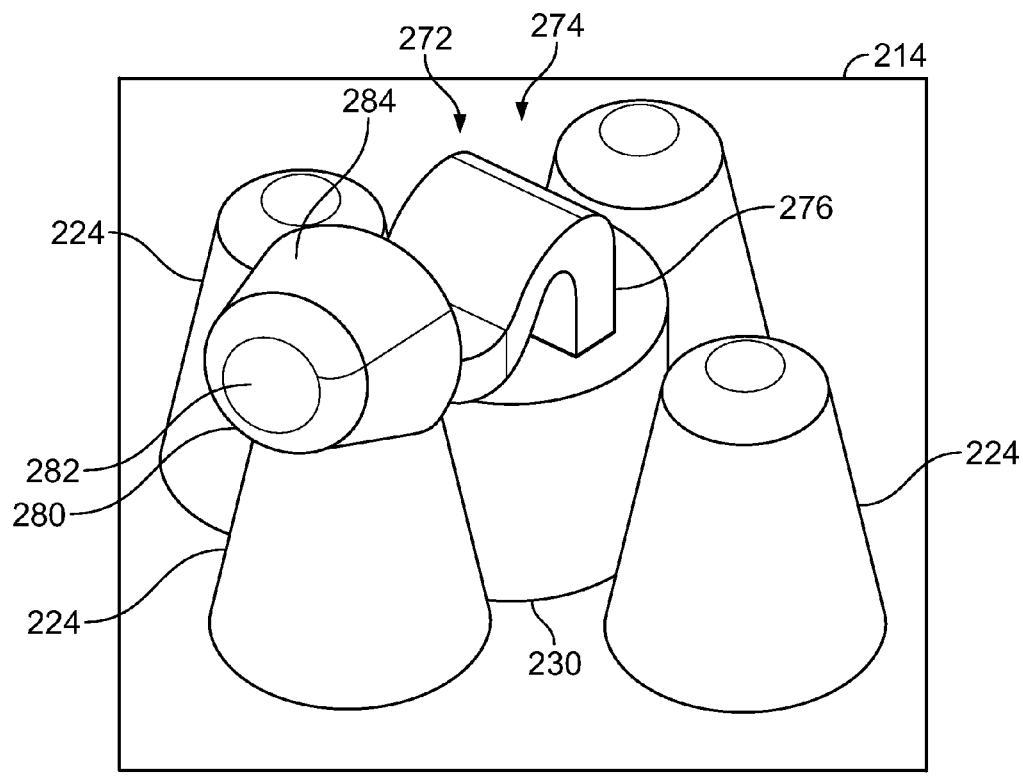
FIG. 9 is a perspective view of another alternative embodiment of an interconnect member.
Figure 10:
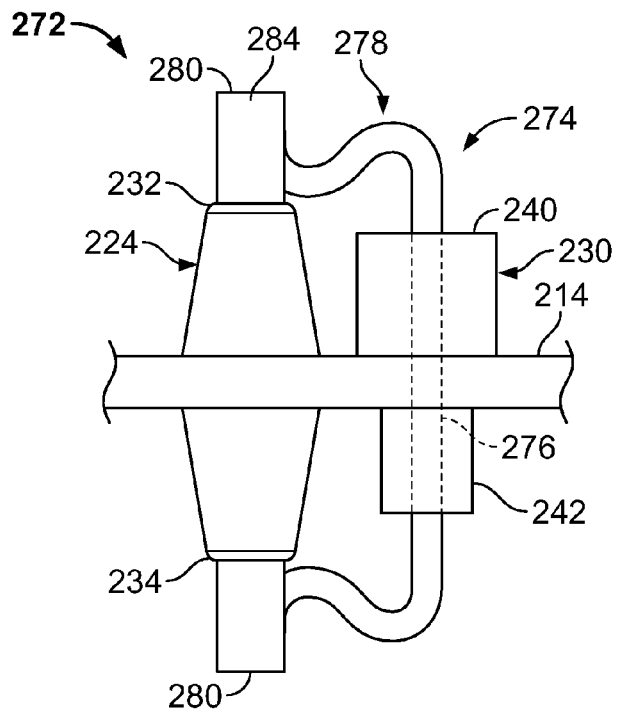
FIG. 10 illustrates an elevational view of the contact assembly shown in FIG. 9.

FIG. 9 illustrates a perspective view of an interconnect member 270 having components common to the interconnect member 210 (FIG. 5) previously described but with a contact assembly 272 that includes an alternative contact 274. FIG. 10 illustrates an elevational view of the contact assembly 272. The contact 274 includes a body 276 that extends between end portions 278. As with the interconnect member 210, the contact 274 is held in the retaining member 230 which is over-molded on the contact body 276. The end portions 278 include contact tips 280. In the illustrated embodiment, the contact tips 280 are cylindrical in shape, defining an interior volume 282 therethrough. More generally, the contact tips 280 may take any geometric shape having an outer perimeter 284 and wherein a portion of the outer perimeter is in closest proximity to the circuit board 114 or the electronic package 120 (FIG. 1) with respect to other portions of the contact 274. The outer perimeter 284 need not be completely closed.

Figure 11:
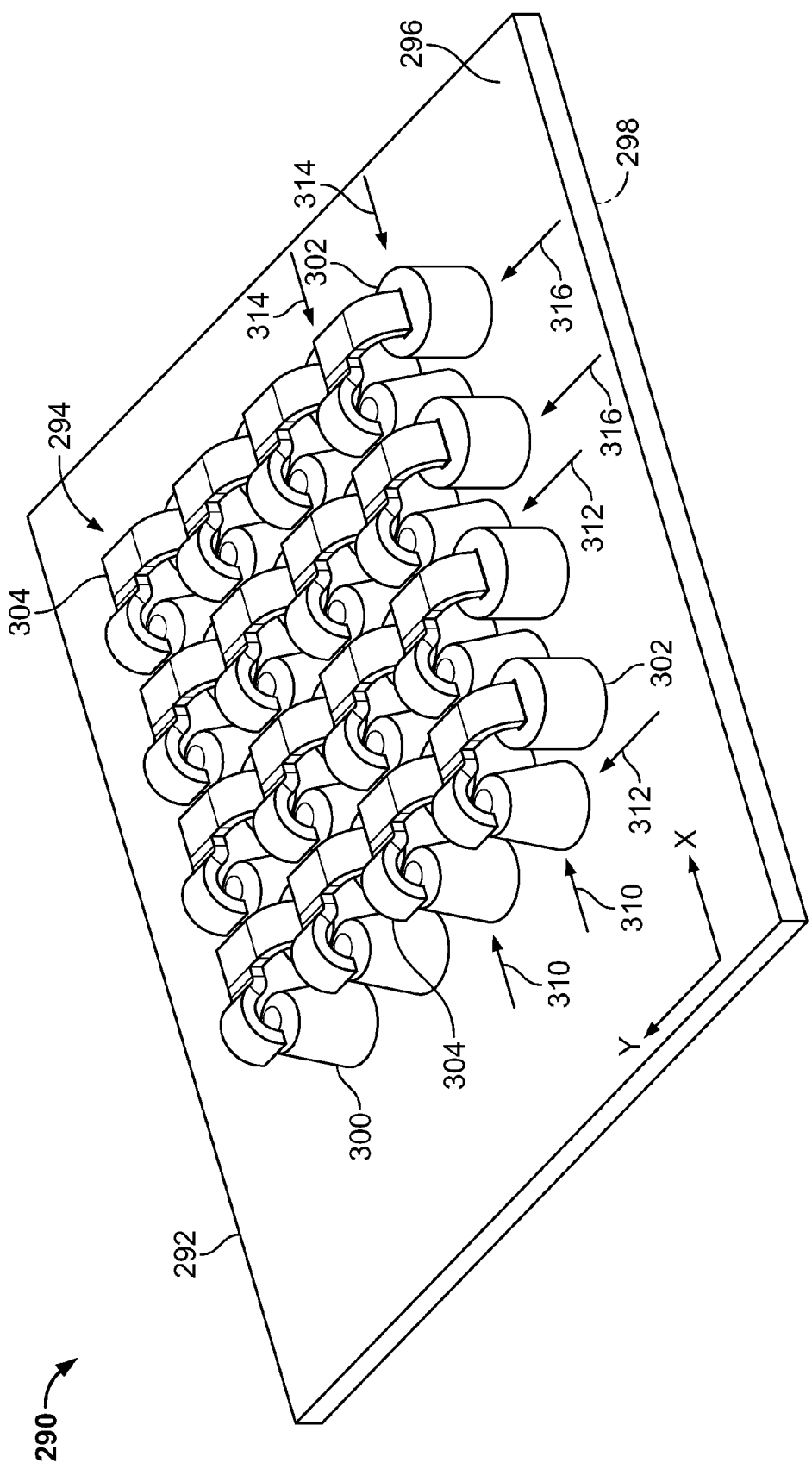
FIG. 11 is a top perspective view of another alternative embodiment of an interconnect member formed in accordance with the present invention.

FIG. 11 illustrates a perspective view of another alternative interconnect member 290. The interconnect member 290 includes a carrier 292 on which a plurality of contact assemblies 294 are arranged. The carrier 292 has a first side 296 and an opposite second side 298. Each contact assembly 294 includes a polymer column 300 and a retaining member 302 holding a contact 304. The polymer column 300 and the retaining member 302 are held in the carrier 292. The polymer columns 300 are similar to the polymer columns 140 previously described and are arranged in an array of rows 310 parallel to the axis arrow X and columns 312 parallel to the axis arrow Y. The retaining members 302 are similar to the retaining members 230 previously described and are arranged in an array of rows 314 that are also parallel to the axis arrow X and columns 316 that are also parallel to the axis arrow Y.

Figure 12:
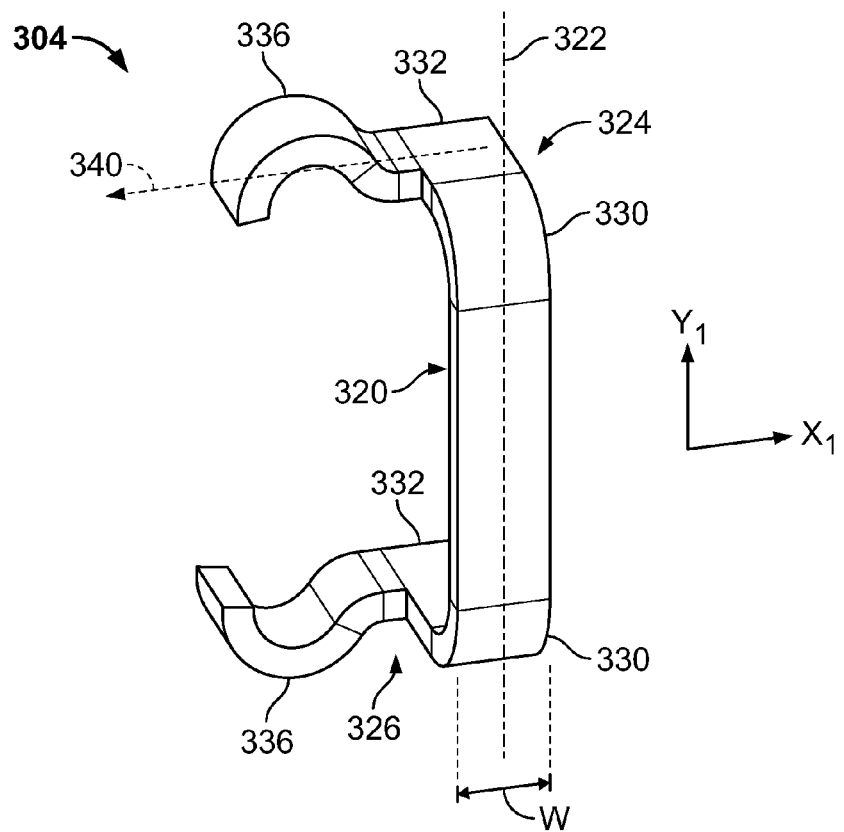
FIG. 12 is a perspective view of the contact shown in FIG. 11.

With continued reference to FIG. 11, FIG. 12 illustrates a perspective view of the contact 304. The contact 304 includes an elongated body 320 that extends along an axis 322 between opposite upper and lower end portions 324 and 326, respectively. The retaining members 302 are over-molded on the body 320. The axis 322 is parallel to the axis arrow $Y_1$. The end portions 324 and 326 are mirror images of one another. The body 320 has a transverse width W that extends in a direction parallel to the axis arrow $X_1$. While the contact width W is shown in FIG. 12 as being constant along the body 320, in other embodiments, the contact width W may vary along a length of the contact body 320. End portions 324 and 326 include arcuate sections 330 joined to the body 320 that orient intermediate sections 332 of the end portions 324 and 326 approximately perpendicularly to the axis 322. Contact tips 336 extend from the intermediate sections 332 in the direction of the arrow 340 which is generally in the direction of the transverse width W or parallel to the axis arrow $X_1$. When installed in the carrier 292, the contact tips 336 extend along an adjacent row 310 of polymer columns 300 and are positioned to engage a polymer column 300 in the row 310. The orientation of the contact tips 336 along the rows 310 of polymer columns 300 facilitates the provision of tooling space for fabrication of the interconnect member 290. The contact tips 336 are formed with an arched shape that covers the ends of the polymer columns 300 and positions the contact tips 336 in closest proximity to the circuit board 114 and the electronic package 120 (FIG. 1) relative to other portions of the contact 304. It is to be noted however, that other contact tip geometries may be provided that also achieve this condition.

Figure 13:
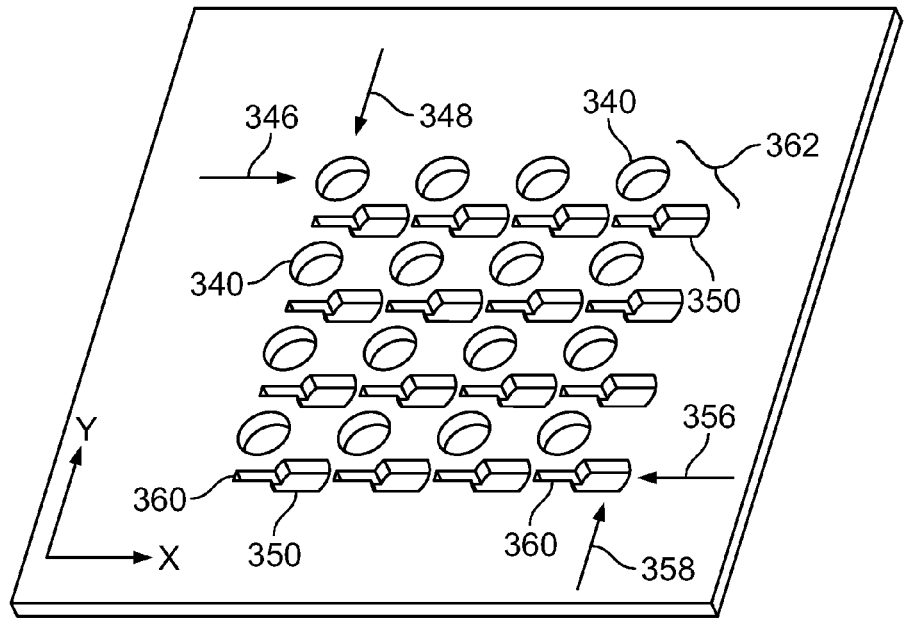
FIG. 13 is a perspective view of the carrier shown in FIG. 11.

With continued reference to FIGS. 11 and 12, FIG. 13 illustrates a perspective view of the carrier 292. The carrier 292 includes a plurality of first apertures 340 arranged in an array including rows 346 parallel to the axis arrow X and columns 348 parallel to the axis arrow Y. The polymer columns 300 are over-molded onto the carrier 292 and held in the apertures 340. The rows 346 and columns 348 may or may not be perpendicular to one another. A plurality of second apertures 350 are arranged in an array including rows 356 parallel to the axis arrow X and columns 358 parallel to the axis arrow Y. The second apertures 350 are sized to receive and hold lower ends (not shown) of the retaining members 302. A plurality of slits 360 are formed in the carrier 292 and extend into the second apertures 350. The first and second apertures 340 and 350 respectfully, and the slits 360 define locations 362 for the contact assemblies 294. The contacts 304, with the over-molded retaining members 302, are installed in the carrier 292 with the contacts 304 in a partially formed state. More specifically, the contacts 304 and retaining members 302 are installed in the carrier 292 with the lower end portion 326 in a flattened state as stamped prior to bending. The slits 360 are sized to receive the flattened lower end portions 326 of the contacts 304. After installation of the contacts 304 and retaining members 302 in the carrier 292, the lower end portions 326 of the contacts 304 are formed into their final geometry. In alternative contact designs, the slits 360 may extend into and through the second apertures 350.

Figure 14:
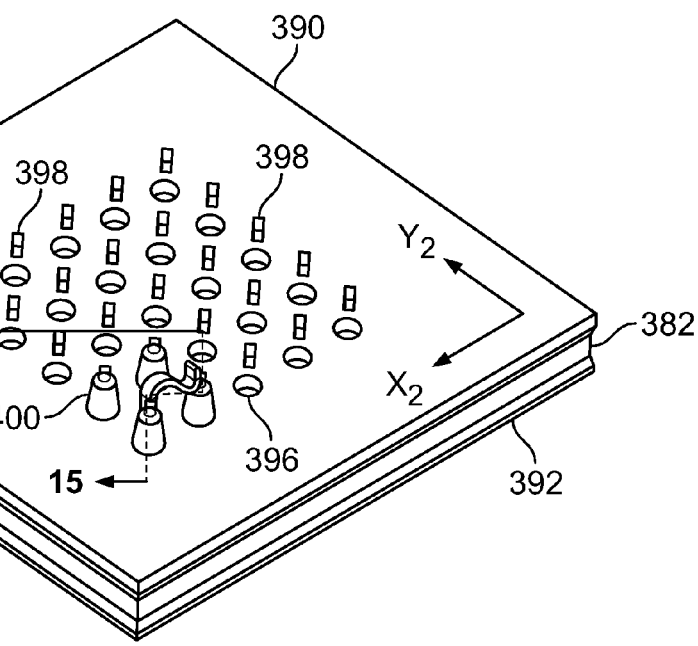
FIG. 14 is a perspective view of a partially assembled interconnect member formed in accordance with an alternative embodiment of the present invention.
Figure 15:
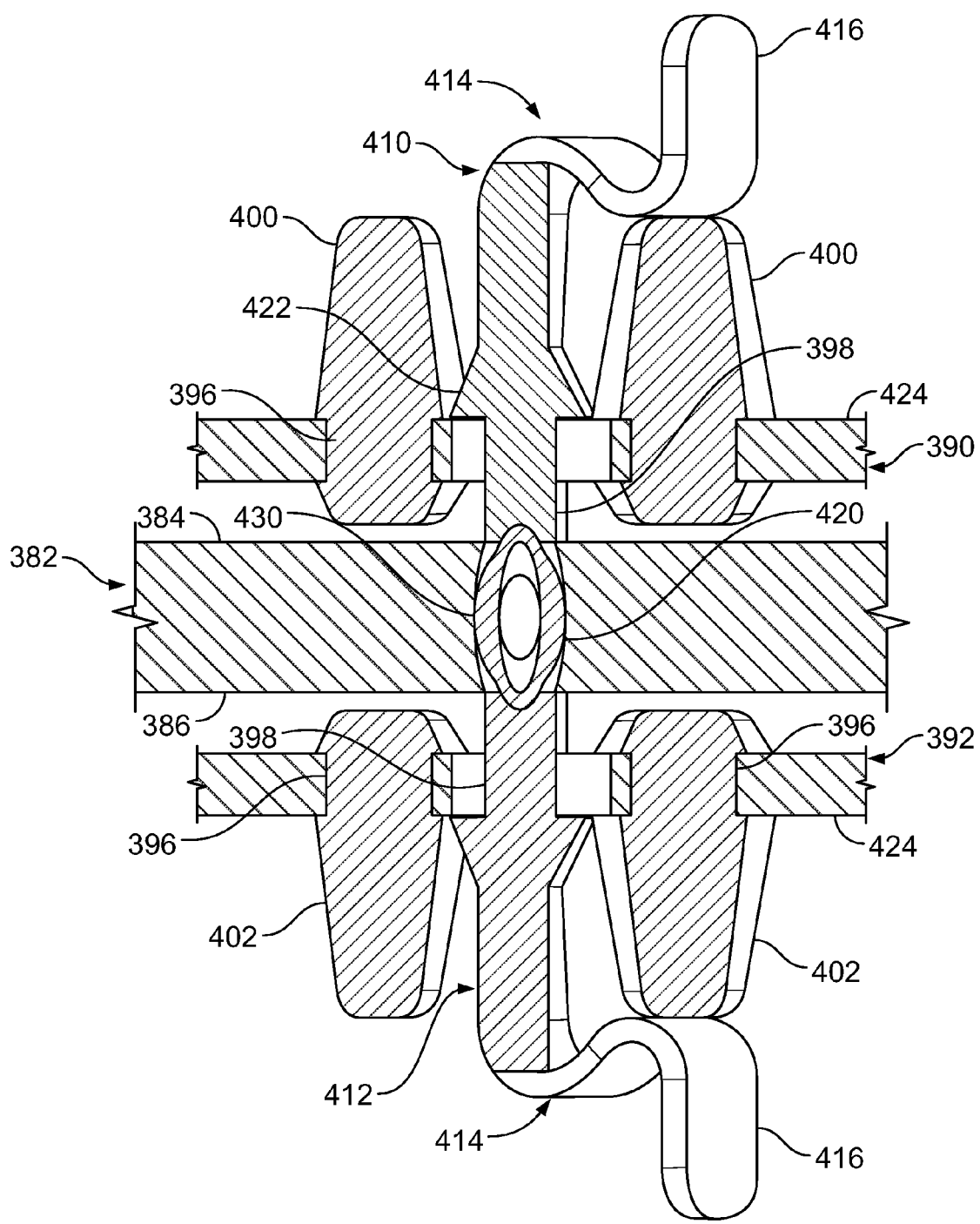
FIG. 15 is a cross-sectional view of a portion of the interconnect member shown in FIG. 14 taken along the line 15-15.

FIG. 14 illustrates a partially assembled interconnect member 380 formed in accordance with another embodiment of the present invention. FIG. 15 illustrates a cross-sectional view of a portion of the interconnect member 380 taken along the line 15-15 in FIG. 14. The interconnect member 380 includes a substrate 382 having a first side 384 and an opposite second side 386. A first carrier 390 is proximate the first side 384 of the substrate 382. A second carrier 392 is proximate the second side 384 of the substrate 382. Each carrier 390, 392 includes an array of apertures 396 arranged in rows parallel to the axis arrow $X_2$ and columns parallel to the axis arrow $Y_2$ and an array of slits 398 also arranged in rows parallel to the axis arrow $X_2$ and columns parallel to the axis arrow $Y_2$. In an exemplary embodiment, the first and second carriers 390, 392 with the apertures 396 and slits 398 are mirror images of one another. A plurality of first polymer columns 400 are held in the first carrier 390 and a plurality of second polymer columns 402 are held in the second carrier 392. More particularly, the polymer columns 400 and 402 are over-molded in their respective carriers 390 and 392.

A plurality of contacts 410 are held in the carriers 390 and 392 and the substrate 382. The contact 410 includes a body 412 that extends between opposite end portions 414 each of which includes a contact tip 416. The contacts 410 are arranged so that each end portion 414 is positioned to engage a respective one of the polymer columns 400, 402 held in each carrier 390, 392. The body 412 of each contact 410 extends through one of the slits 398 in each carrier 390, 392 and through a passageway 420 in the substrate 382. The contact body 412 includes shoulders 422 that engage an outer surface 424 of at least one of the carriers 390, 392. A retention feature 430 is formed on the contact body 412 and is configured to engage the substrate 382 to retain the contact 410 in the substrate 382. In one embodiment, the retention feature is an eye of the needle formed in the contact body 412. In other embodiments, the retention feature may be a compliant pin, a crimp, or a solder or weld connection. The contact tips 416 comprise upturned ends configured to engage contact pads (not shown) on the circuit board 114 and the electronic package 120. In other embodiments, other contact tip geometries may be employed.

The embodiments thus described provide a compressible interconnect system that may be fabricated at a reduced contact pitch to meet demands for higher contact densities in socket connectors. The interconnect member separates mechanical properties in the polymer columns so that the contacts have only to satisfy electrical requirements for the interconnect member. The interconnect member can be easily and economically manufactured and maintains improved high speed electrical performance.

While the invention has been described in terms of various specific embodiments, those skilled in the art will recognize that the invention can be practiced with modification within the spirit and scope of the claims.

What is claimed is:

1. An interconnect member for a socket connector comprising:
    a carrier having opposite first and second sides;
    a plurality of polymer columns held in said carrier, each said polymer column including a first end extending from said first side of said carrier and a second end extending from said second side of said carrier;
    a contact array comprising a plurality of electrical contacts held in said carrier, each of said plurality of contacts including a body extending through said carrier and opposite end portions positioned to engage respective said first and second ends of said polymer columns, each said end portion including a contact tip configured to electrically engage a contact pad on one of a circuit board and an electronic package; and
    a plurality of insulative retaining members held in said carrier, each of said insulative retaining members holding one of said plurality of contacts,
    wherein said polymer columns simultaneously provide a predetermined normal force to establish reliable electrical connectivity between the circuit board and the electronic package and a predetermined working range for the interconnect member.

2. The interconnect member of claim 1, wherein said carrier is fabricated from a non-conductive material.

3. The interconnect member of claim 1, wherein said carrier is fabricated from an insulated metal.

4. The interconnect member of claim 1, wherein a portion of said contact body is coated with an insulative material.

5. The interconnect member of claim 1, wherein said polymer columns comprise a pure polymer.

6. The interconnect member of claim 1, wherein each said contact body includes a locking tab to retain said contact in said carrier.

7. The interconnect member of claim 1, wherein said carrier includes a plurality of slits sized to receive said end portions of respective ones of said plurality of contacts.

8. The interconnect member of claim 1, wherein each of said plurality of insulative retaining members is over-molded on a respective one of said plurality of contacts.

9. The interconnect member of claim 1, wherein said carrier includes a plurality of apertures holding said retaining members and a plurality of slits sized to receive said end portion of a respective one of said contacts, each said slit extending into one of said apertures.

10. The interconnect member of claim 1, wherein said insulative retaining members are arranged in rows and said interconnect member further includes a tie bar interconnecting said insulative retaining members in each row.

11. The interconnect member of claim 1, further comprising a substrate having opposite first and second sides and wherein said carrier comprises a first carrier proximate said first side of said substrate and a second carrier proximate said second side of said substrate and said plurality of polymer columns comprises a plurality of first polymer columns held in said first carrier and a plurality of second polymer columns held in said second carrier and wherein one of said end portions of each of said plurality of contacts is positioned to engage a respective one of said plurality of first polymer columns and the other of said end portions of each of said plurality of contacts is positioned to engage a respective one of said plurality of second polymer columns.

12. The interconnect member of claim 11, wherein said body of each of said plurality of contacts includes a retaining feature to retain said body in said substrate.

13. The interconnect member of claim 1, wherein said body of each said contact has a transverse width and said end portion includes an intermediate section, and wherein said contact tips extend from said intermediate section in a direction parallel to a direction of the transverse width to position the contact tips along a row of polymer columns to engage a polymer column in the row.

14. The interconnect member of claim 1, wherein said contact tip comprises an upturned contact end.

15. The interconnect member of claim 1, wherein said contact tip comprises an outer perimeter that defines an interior volume that is at least partially enclosed by said outer perimeter, wherein a portion of said outer perimeter is configured to engage a contact pad on one of the circuit board and the electronic package.

16. A socket connector for connecting an electronic package to a circuit board, said socket connector comprising:

a dielectric housing configured to be mounted on the circuit board; and an interconnect member held in said housing, said interconnect member comprising:

a carrier having opposite first and second sides;

a plurality of polymer columns held in said carrier, each said polymer column including a first end extending from said first side of said carrier and a second end extending from said second side of said carrier;

a contact array comprising a plurality of electrical contacts held in said carrier, each of said plurality of contacts including a body extending through said carrier and opposite end portions positioned to engage respective said first and second ends of said polymer columns, each said end portion including a contact tip configured to electrically engage a contact pad on one of a circuit board and an electronic package; and a plurality of insulative retaining members held in said carrier, each of said insulative retaining members holding one of said plurality of contacts, wherein said polymer columns simultaneously provide a predetermined normal force to establish reliable electrical connectivity between the circuit board and the electronic package and a predetermined working range for the interconnect member.

17. The socket connector of claim 16, wherein said body of each said contact has a transverse width and said end portion includes an intermediate section, and wherein said contact tips extend from said intermediate sections in a direction parallel to a direction of the transverse width to position the contact tips along a row of polymer columns to engage a polymer column in the row.

18. The socket connector of claim 16, wherein said contact tip comprises an outer perimeter that defines an interior volume that is at least partially enclosed by said outer perimeter, wherein a portion of said outer perimeter is configured to engage a contact pad on one of the circuit board and the electronic package.

19. The interconnect member of claim 1, wherein each of the insulative retaining members protrudes from each of the first and second sides.

20. The socket connector of claim 16, wherein each of the insulative retaining members protrudes from each of the first and second sides.

* * * * *